US005430395A

United States Patent [19]

Ichimaru

[11] Patent Number: 5,430,395

[45] Date of Patent: Jul. 4, 1995

[54] TEMPERATURE COMPENSATED CONSTANT-VOLTAGE CIRCUIT AND TEMPERATURE COMPENSATED CONSTANT-CURRENT CIRCUIT

[75] Inventor: Kouzo Ichimaru, Kunisaki, Japan

[73] Assignee: Texas Instruments Incorporated, Dallas, Tex.

[21] Appl. No.: 23,979

[22] Filed: Feb. 26, 1993

[30] Foreign Application Priority Data

Mar. 2, 1992 [JP] Japan .................................. 4-080526

[51] Int. Cl.[6] .............................................. H03K 5/08

[52] U.S. Cl. .................................... 327/312; 327/512; 327/362; 327/538

[58] Field of Search ..................... 307/264, 491, 296.6, 307/310, 546; 323/313, 314, 315, 907

[56] References Cited

U.S. PATENT DOCUMENTS 4,833,344 5/1989 Moon et al. ...................... 307/296.6

FOREIGN PATENT DOCUMENTS 0093533 5/1985 Japan .................................. 323/313

*Primary Examiner*—William L. Sikes
*Assistant Examiner*—James A. Dudek
*Attorney, Agent, or Firm*—Dana L. Burton; James C. Kesterson; Richard L. Donaldson

[57] ABSTRACT

A constant-voltage circuit which can be driven by a low voltage (lower than 1 V) of a nickel-cadmium battery, etc., and which provides a temperature-compensated stable voltage output. The constant-voltage circuit comprises battery 1, band-gap-type current-mirror-type constant-current source circuit 3 which outputs collector current $I_{C9}$ of transistor $Q_9$ with a positive temperature coefficient, current source circuit 5 which outputs collector current $I_{C8}$ of transistor $Q_8$ having a negative temperature coefficient and defined by base-emitter voltage $V_{BEQ7}$ of transistor $Q_7$, and a load resistor element $R_0$. At node $N_0$, collector current $I_{C9}$ and collector current $I_{C8}$ are added. The temperature coefficients of these two currents cancel each other. Consequently, the current at node $N_0$ does not have temperature dependence. Load resistor element $R_0$ converts this current to a voltage as the output voltage $V_{OUT}$.

10 Claims, 2 Drawing Sheets

TEMPERATURE COMPENSATED CONSTANT-VOLTAGE CIRCUIT AND TEMPERATURE COMPENSATED CONSTANT-CURRENT CIRCUIT

FIELD OF INVENTION

This invention concerns a type of constant-voltage circuit and a type of constant-current circuit. More specifically, this invention concerns a type of temperature-compensation constant-voltage circuit or constant-current circuit as the constant-voltage circuit and constant-current circuit used as a reference voltage source in an analog IC.

BACKGROUND OF THE INVENTION

FIG. 4 shows a conventional type of constant-voltage circuit (reference voltage source circuit) using the band-gap reference voltage of the bipolar transistor.

The constant-current circuit shown in FIG. 4 has battery 21, current source circuit 23, and band-gap reference circuit 25.

As shown in the figure, band-gap reference circuit 25 is made of the following elements connected to each other: resistor element $R_{21}$, npn-type bipolar transistor $Q_{21}$, resistor element $R_{22}$, npn-type bipolar transistor $Q_{22}$, resistor element $R_{23}$, and npn-type bipolar transistor $Q_{23}$.

As the reference voltage $V_{ref}$ in band-gap reference circuit 25 is determined by the energy band-gap voltage $V_{BG}$(1.205 V) of silicon-extrapolated to Kelvin temperature 0° K., reference voltage $V_{ref}$ is called the band-gap reference.

Current source circuit 23 acts as the current source of band-gap reference circuit 25, and a constant current $I_{23}$ is fed to band-gap reference circuit 25.

For example, transistor $Q_{22}$ operates with a current density about 10 times that of transistor $Q_{22}$, and a difference of base-emitter voltage $\Delta V_{BE}$ between transistor $Q_{21}$ and transistor $Q_{22}$ is generated between the terminals of resistor element $R_{23}$.

When the current gain of the transistor is high, voltage $V_{R22}$ between the terminals of resistor element $R_{22}$ as represented by the following formula is generated:

$$V_{R22}\Delta V_{BE}(RV_{23}/RV_{22}) \qquad (1)$$

where, $RV_{22}$ is the resistance of resistor element $R_{22}$, and $RV_{23}$ is the resistance of resistor element $R_{23}$.

In this band-gap reference circuit 25, band-gap reference voltage $V_{BG}$ (reference voltage $V_{ref}$) can be represented as follows:

$$V_{BG}=V_{ref}=V_{BE22}+(RV_{23}/RV_{22})\cdot\Delta V_{BE} \qquad (2)$$

where, $V_{BE22}$ represents the base-emitter voltage of $Q_{22}$.

This energy band-gap voltage $V_{BG}$ is reference voltage $V_{ref}$, and it is fed as output voltage $V_{OUT}$ of the constant-voltage circuit to the load.

Transistor $Q_{23}$ forms the gain section that stabilizes the aforementioned energy band-gap voltage $V_{BG}$.

The temperature compensation for band-gap reference circuit 25 is performed as follows:

The base-emitter voltage $V_{BE}$ of the bipolar transistor can be represented as follows:

$$V_{BE}\approx V_{G0}(1-T/T_0)+V_{BE0}(T/T_0) \qquad (3)$$

where,

T is the operation temperature (Kelvin temperature K) of the bipolar transistor;

$T_0$ represents absolute zero (0° K.);

$V_{G0}$ represents the energy band-gap voltage at absolute zero; and $V_{BE0}$ represents base-emitter voltage at $T_0$ with a collector current of $I_{C0}$ at $T_0$.

When the current densities of transistors $Q_{21}$ and $Q_{22}$ are $J_1$ and $J_2$, respectively, the difference voltage $\Delta V_{BE}$ of the base-emitter voltage between these two transistors becomes:

$$\Delta V_{BE}=(kT/q)\ ln\ (J_1/J_2) \qquad (4)$$

where, k is Boltzman constant, and q is the charge of electron.

From formulas 2–4, reference voltage $V_{ref}$ is represented by the following formula:

$$\begin{aligned} V_{ref} &= V_{BE22}+(RV_{23}/RV_{22})\cdot\Delta\ V_{BE} \\ &= V_{G0}(1-T/T_0)+V_{BE0}(T/T_0)+ \\ &\quad (RV_{23}/RV_{22})(kT/q)\ln(J_1/J_2) \end{aligned} \qquad (5)$$

When reference voltage $V_{ref}$ is partially differentiated with respect to the absolute temperature T, one has:

$$+(RV_{23}/RV_{22})\ (kT_0/q)\ ln\ (J_1/J_2) \qquad (6)$$

The temperature compensation condition for the independence of reference temperature $V_{ref}$ on the temperature is $$\partial V_{ref}/\partial T=0$$

and one has:

$$V_{G0}=V_{BE0}+(RV_{23}/RV_{22})\ (kT_0/q)\ ln\ (J_1/J_2) \qquad (7)$$

When this band-gap [voltage] $V_{G0}$ is substituted into formula 5, one has:

$$V_{ref}=V_{BE22}+(RV_{23}/RV_{22})\ (kT_0/q)\ ln\ (J_1/J_2) \qquad (8)$$

As reference voltage $V_{ref}$ in this formula does not contain operation temperature T, there is no dependence on the temperature.

As can be seen from formula (4), $(kT_0/q)\ln(J_1/J_2)$ is $\Delta V_{BE0}$ at temperature $T_0$; hence, reference voltage $V_{ref}$ can be represented by the following formula:

$$V_{ref}=V_{BE22}+(RV_{23}/RV_{22})\ \Delta V_{BE0} \qquad (9)$$

As base-emitter voltage $V_{BE22}$ of transistor $Q_{22}$ has a negative temperature coefficient, while resistor element $R_{23}$ has a positive temperature coefficient, difference voltage $\Delta V_{BE}$ of the base-emitter voltage between the two transistors, that is, voltage between terminals $V_{R23}$, has a positive temperature coefficient.

As can be seen from the aforementioned analysis, by setting appropriately the ratio of resistance of the voltage dividing resistor elements $(RV_{22}/RV_{23})$, the base-emitter voltage $V_{BE22}$ of transistor $Q_{22}$ and $(RV_{22}/RV_{23})\cdot\Delta V_{BE}$ (or, $(RV_{22}/RV_{23})\cdot V_{R23}$) cancel each other, and the temperature coefficient of energy band-gap voltage $V_{BG}$ approaches "0".

The base-emitter voltage $V_{BE22}$ of bipolar transistor $Q_{22}$ is about 0.6–0.7 V; when $(RV_{23}/RV_{22})\Delta V_{BE0}$ in the case of temperature compensation is taken into consideration, the band-gap reference voltage $V_{BG}$ of silicon is usually about 1.2 V.

Consequently, battery 21 used for operation of band-gap reference circuit 25 should be a battery with an output voltage of 1.2 V or higher. Usually, a battery with an output voltage of about 1.5 V is used.

Recently, for electronic devices, there is a tendency toward reducing the size, the voltage, and the power consumption. Accordingly, there is a demand on using a small-sized low-voltage battery to drive band-gap reference circuit 25.

For example, there is a high demand on using only a single battery with a small size and a voltage lower than 1 V, such as a nickel-cadmium battery of about 0.9 V to drive a constant-voltage circuit which generates a temperature-compensated reference voltage lower than 1 V.

However, the constant-voltage circuit using the conventional band-gap reference circuit 25 as shown in FIG. 4 cannot meet the aforementioned demand.

SUMMARY OF THE INVENTION

The purpose of this invention is to solve the aforementioned problems of the conventional methods by providing a type of constant-voltage circuit characterized in that the aforementioned problems are solved by using a constant-voltage circuit having a band-gap reference circuit, with temperature compensation well carried out for the circuit, which can operate at a voltage lower than 1 V and with a low power consumption and a high stability.

Also, this invention provides a type of constant-current circuit related to the aforementioned constant-voltage circuit.

In order to realize the aforementioned purpose, this invention provides a constant-voltage circuit characterized in that it comprises the following parts: a first constant-current source circuit having the first temperature coefficient; a second constant-current source circuit which is set in parallel to the aforementioned first constant-current source circuit and which has a reverse temperature coefficient with an absolute value nearly equal to that of the absolute value of the aforementioned first constant-current source circuit; and a current conversion element which can convert the sum of the current from the aforementioned first constant-current source circuit and the current from the aforementioned second constant-current source circuit into a voltage.

More specifically, the aforementioned first constant-current source circuit contains a current-mirror-type constant-current source circuit, and it outputs a first current with a positive temperature coefficient to the current conversion element.

The aforementioned second constant-current source circuit has a constant-current source circuit made of a bipolar transistor with its base-emitter voltage having a negative temperature coefficient and a series resistor element connected between the base and emitter of the aforementioned bipolar transistor, as well as a voltage dropping resistor element set in parallel to the aforementioned bipolar transistor. In this second constant-current source circuit, the value of the aforementioned voltage dropping resistor element is selected appropriately to ensure that the base-emitter voltage of the aforementioned bipolar transistor is equal to the portion of the base-emitter voltage divided by the aforementioned series resistor element. The aforementioned second constant-current source circuit outputs the second current with a negative temperature coefficient to the aforementioned current conversion element.

It is preferred that the ratio of area between the one pair of bipolar transistors that form the current-mirror-type constant-current source circuit in the aforementioned first constant-current source circuit as well as the series resistor element and voltage dropping resistor element in the aforementioned second constant-current source circuit are adjusted to ensure that the aforementioned positive temperature coefficient and the aforementioned negative temperature coefficient cancel each other.

The constant-current circuit of this invention comprises a first constant-current source circuit having a first temperature coefficient and a second constant-current source circuit which is set in parallel to the aforementioned first constant-current source circuit and which has a reverse temperature coefficient with an absolute value nearly equal to that of the temperature coefficient of the first constant-current source circuit; and it outputs the sum of the current from the aforementioned first constant-current source circuit and the current from the aforementioned second constant-current source circuit.

In the constant-voltage circuit of this invention, the temperature dependence is nullified by means of a combination of a first constant-current source circuit having the first temperature coefficient and a second constant-current source circuit which has a reverse temperature coefficient with an absolute value nearly equal to that of the temperature coefficient of the first constant-current source circuit.

The sum of the current from the first constant-current source circuit and the current from the aforementioned second constant-current source circuit is converted into a voltage by means of a resistor element or other current conversion element, and the constant voltage is output.

The first constant-current source circuit contains a current-mirror-type constant-current source circuit and it acts as a stable constant-current source circuit. This current-mirror-type constant-current source circuit has a positive temperature coefficient.

The second constant-current source circuit has bipolar transistor with a negative temperature coefficient, with appropriate circuit parameters designed to ensure cancellation with the aforementioned positive temperature coefficient.

More specifically, the ratio of area of the emitter between the one pair of bipolar transistors that form the current-mirror-type constant-current source circuit, that is, the ratio of the emitter current, as well as the values of the series resistor element and voltage dropping resistor element in the aforementioned second constant-current source circuit are adjusted appropriately to ensure cancellation between the aforementioned positive temperature coefficient and the aforementioned negative temperature coefficient.

The constant-current circuit of this invention has a circuit configuration with the current conversion element excluded from the aforementioned constant-voltage circuit.

The current from this constant-current circuit becomes a fully temperature-compensated current.

Figure 1:
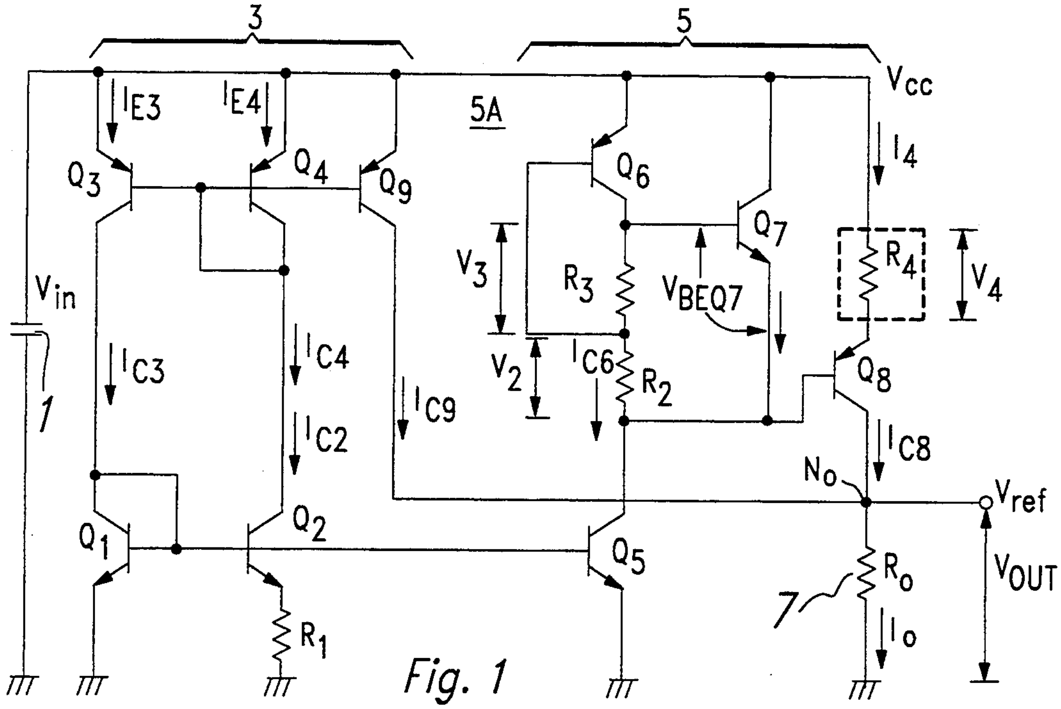
FIG. 1 is a circuit diagram of the constant-voltage circuit in Embodiment 1 of this invention.

In reference numerals as shown in the drawings:

1, battery

3, band-gap-type current-mirror-type constant-current circuit

5, constant-current source circuit 5A, constant-current circuit

7, current conversion element

21, battery

23, constant-current source circuit

25, band-gap reference circuit $Q_1$–$Q_9$: bipolar transistors $Q_{11}$–$Q_{19}$, bipolar transistors $Q_{21}$–$Q_{23}$, bipolar transistor $R_1$–$R_4$, resistor element $R_0$, load resistor element $R_{21}$–$R_{23}$, resistor element

DESCRIPTION OF PREFERRED EMBODIMENTS

FIG. 1 shows the constant-voltage circuit in Embodiment 1 of this invention.

This constant-voltage circuit is made of battery 1, band-gap-type current-mirror-type constant-current source circuit 3, constant-current source circuit 5, and load resistor element $R_0$, which are connected to each other as shown in the figure.

In this embodiment, battery 1 is a single nickel-cadmium (NiCd) battery with an output voltage lower than 1 V, say, 0.9 V.

Band-gap-type, current-mirror-type constant-current source circuit 3 consists of npn-type bipolar transistors $Q_1$ and $Q_2$ connected with bases connected together, resistor element $R_1$ connected between the emitter of transistor $Q_2$ and the ground potential GND (ground), and pnp-type bipolar transistors $Q_3$, $Q_4$, $Q_9$ with bases connected together. The base and collector of transistor $Q_1$ are connected. Also, the base and collector of transistor $Q_4$ are connected.

Figure 4:
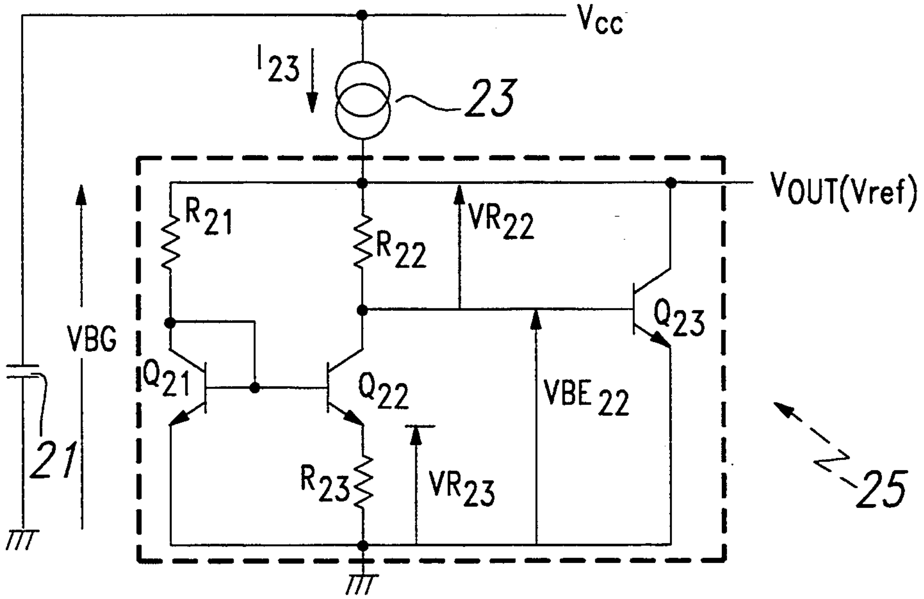
Fig. 4 PRIOR ART
FIG. 4 is a diagram of a conventional band-gap-type constant-voltage circuit.

In current-mirror-type constant-current source circuit 3, the circuit consisting of pnp-type transistors $Q_1$ and $Q_2$, and $Q_3$ and $Q_4$, as well as resistor element $R_1$ has the same configuration as the band-gap-type constant-current source circuit shown in FIG. 4.

Current power circuit 5 is made of constant-current source circuit 5A and resistor element $R_4$, which is a voltage equivalent circuit element.

Constant-current source circuit 5A consists of npn-type bipolar transistor $Q_5$, pnp-type bipolar transistor $Q_6$, npn-type bipolar transistor $Q_2$, resistor element $R_3$, and pnp-type bipolar transistor $Q_8$.

The collector of transistor $Q_6$ is connected to the base of transistor $Q_7$, the collector of transistor $Q_6$ is connected to the base of $Q_6$ through resistor element $R_3$.

The base of npn-type bipolar transistor $Q_5$ is connected together with the base of transistor $Q_2$ of current-mirror-type constant-current source circuit 3, and it functions as a constant-current source circuit.

In constant-current source circuit 5A, base-emitter voltage $V_{BEQ7}$ of transistor $Q_7$ has a negative temperature coefficient; hence, transistor $Q_7$ functions as an element having negative temperature coefficient.

Resistor element $R_3$ and resistor element $R_2$ are connected in series between base and emitter of transistor $Q_7$, and voltage between terminals V3 of resistor element $R_3$ obtained by dividing base-emitter voltage $V_{BEQ7}$ is applied between the base and collector of transistor $Q_6$.

Resistor element $R_4$ used as a voltage equilibrium circuit element has an appropriate resistance to ensure that its voltage between terminal V4 is equal to voltage between terminal V2 of resistor element $R_2$.

Load resistor element $R_0$ used as current conversion element 7 converts the current flowing into node N0 to a voltage, and the constant-voltage circuit outputs voltage $V_{OUT}$ in the operation.

As to be explained later, as this load resistor element $R_0$ is removed, the circuit shown in FIG. 1 functions as a constant-current circuit.

The first current-mirror-type circuit made of a pair of transistors $Q_1$ and $Q_2$ and the second current-mirror-type made of a pair of $Q_3$ and $Q_4$ are connected symmetrically, forming a current-mirror-type circuit with overly high precision and high stability.

This current-mirror-type constant-current source circuit 3 is the aforementioned band-gap-type constant-current circuit, and it forms the temperature-compensation-type constant-current source circuit.

As to be explained in detail in the following, collector current $I_{C9}$ of transistor $Q_9$ applied with the same base current as that for the base of transistor $Q_4$ has a positive temperature coefficient.

In the following, a detailed explanation will be presented for the temperature compensation of the constant-voltage circuit shown in FIG. 1.

First of all, collector current $I_{C9}$ of transistor $Q_9$.

As base current $I_B$ of a bipolar transistor in the active operation mode can be neglected compared to emitter current $I_E$ and collector current $I_C$, emitter current $I_E$ is nearly equal to collector current $I_C$ ($I_E \approx I_C$). Consequently, collector current $I_{C3}$ of transistor $Q_3$ is nearly equal to emitter current $I_{E3}$ of transistor $Q_3$ ($I_{C3} \leqq I_{E3}$, and collector current $I_{C4}$ of transistor $Q_4$ is nearly equal to emitter current $I_{E4}$ of transistor $Q_4$ ($IC_4 \approx I_{E4}$).

In current-mirror-type constant-current source circuit 3, from its operation principle, collector current $I_{C3}$ of transistor $Q_3$ is equal to collector current $I_{C4}$ of transistor $Q_4$ ($I_{C3} = I_{C4}$).

As the base of transistor $Q_9$ is connected to the base of transistor $Q_4$ and it operates as a portion of current-mirror-type constant-current source circuit 3, collector current $I_{C9}$ of transistor $Q_9$, collector current $I_{C3}$ of transistor $Q_3$, and collector current $I_{C4}$ of transistor $Q_4$ are equal to each other ($I_{C9} = I_{C3} = I_{C4}$). If the base current can be neglected, they are also equal to collector current $I_{C2}$ of transistor $Q_2$.

That is, when $I_{C9} = I_{C4} = I_{E2} = I_{C3} = I_{E1}$, collector current $I_{C9}$ of transistor $Q_9$ is nearly equal to collector current $I_{C2}$ of transistor $Q_2$ ($I_{C9} \approx I_{C2}$).

Consequently, one obtains the following equation:

$$I_{C9} \approx I_{C2} = (V_{BEQ1} - V_{BEQ2})/RV_1 \quad (10)$$

where, $V_{BEQ1}$ represent the base-emitter voltage of transistor $Q_1$;

$V_{BEQ2}$ represents the base-emitter voltage of transistor $Q_2$; and $RV_1$ represents the resistance of resistor element $R_1$.

Equation 10 may be rewritten as follows:

$$I_{C2}=V_T \cdot ln\ (E_{A2}/E_{A1})/RV_1 \quad (11)$$

where, $E_{A1}$ represents the area of the emitter of transistor $Q_1$;

$E_{A2}$ represents the area of emitter of transistor $Q_2$; and ln represents natural logarithmic operation.

$V_T$ of a bipolar transistor may be represented as follows:

$$V_T=kT/q \quad (12)$$

where, k represents Boltzman constant,

T represents the temperature (absolute temperature) of transistor, and q represents the charge of electron.

$V_T$ can be approximately represented by the following linear formula by using the temperature t in °C.:

$$V_T=23.5\times10^{-3}\ [mV]+86\ [\mu V/°C.]\cdot t[°C.] \quad (13)$$

Consequently, collector current $I_{C2}$ of transistor $Q_2$ and collector current $I_{C9}$ of transistor $Q_9$ can be represented as follows:

$$I_{C9}=I_{C2}=(23.5\times10^{-3}+86\times10^{-6}\cdot t)\cdot ln\ (E_{A2}/E_{A1})/RV_1 \quad (14)$$

From formula 14, it can be seen that collector current $I_{C9}$ of transistor $Q_9$ has a positive temperature coefficient.

Now, let us consider the temperature coefficient of collector current $I_{C8}$ of transistor $Q_8$.

The voltage between terminals V4 of resistor element $R_4$ is equal to the voltage between terminal V2 of resistor element $R_2$, and they are defined a follows:

$$V4=V_{BEQ6}+V_{BEQ7}\cdot(RV_2/(RV_2+RV_3))-V_{BEQ8} \quad (15)$$

where, $V_{BEQ6}$ represents the base-emitter voltage of transistor $Q_6$;

$V_{BEQ7}$ represents the base-emitter voltage of transistor $Q_7$;

$V_{BEQ8}$ represents the base-emitter voltage of transistor $Q_8$;

$RV_2$ represents the resistance of resistor element $R_2$; and $RV_3$ represents the resistance of resistor element $R_3$.

As the base-emitter voltage $V_{BEQ6}$ of transistor $Q_6$ is nearly equal to the base-emitter voltage $V_{BEQ8}$ of transistor $Q_8$ ($V_{BEQ6}\approx V_{BEQ8}$), the voltage between terminal V4 of resistor element $R_4$ is represented by the following formula:

$$V4=(V_{BEQ7}\cdot RV_2)/(RV_2+RV_3) \quad (16)$$

Collector current $I_{C8}$ of transistor $Q_8$ can be represented by the following formula by means of the inter-terminal voltage V4 of said resistor element $R_4$ and the resistance value $RV_4$ of resistor element $R_4$:

$$I_{C8}=(V_{BEQ7}\cdot RV_2)/[(RV_2+RV_3)RV_4] \quad (17)$$

The base-emitter voltage $V_{BEQ7}$ of transistor $Q_7$ has a negative temperature coefficient, and the typical value of base-emitter voltage $V_{BE}$ of the bipolar transistor is as follows:

$$V_{BE}=0.76[V]-2.5\times10^{-3}\ [V/K]\cdot t[°C.] \quad (18)$$

When this base-emitter voltage $V_{BE}$ is substituted into formula 17, one obtains the following formula:

$$I_{C8}=(0.76-2.5\times10^{-3}\cdot t)\cdot RV_2/[(RV_2+RV_3)\cdot RV_4] \quad (19)$$

Output voltage $V_{OUT}$ at node $N_0$ is defined by the following formula:

$$V_{OUT}=(I_{C8}+I_{C9})\cdot RV_0 \quad (20)$$

where, $RV_0$ represents the resistance value $RV_0$ of load resistor element $R_0$.

When formula 20 is substituted into formula 14 and 19, output voltage $V_{OUT}$ can be represented by the following formula:

$$\begin{aligned} V_{OUT} &= (RV_0/RV_1)\cdot \ln(E_{A2}/E_{A1})\cdot (23.5\times10^{-3}+86\times10^{-6}\cdot t) + (RV_0\cdot RV_2)/[(RV_2+RV_3)\cdot RV_4]\cdot (0.76-2.5\times10^{-3}\cdot t) \\ &= (RV_0/RV_1)\cdot \ln(E_{A2}/E_{A1})\cdot(23.5\times10^{-3}) + 0.76\times(RV_0\cdot RV_2)/[(RV_2+RV_3)\cdot RV_4] + (RV_0/RV_1)\cdot\ln(E_{A2}/E_{A1})\cdot(86\times10^{-6}\cdot t) - (RV_0\cdot RV_2)/[(RV_2+RV_3)\cdot RV_4]\cdot(2.5\times10^{-3}\cdot t) \end{aligned} \quad (21)$$

In consideration of the temperature compensation, items 3 and 4 in formula 21 cancel each other. That is, temperature compensation is performed when one has:

$$ln(E_{A2}/E_{A1})\approx29\cdot(RV_1\cdot RV_2)/[(RV_2+RV_3)\cdot RV_4] \quad (22)$$

Consequently, the circuit shown in FIG. 1 may be formed to meet the conditions defined by said formula 22. More specifically, the constant-voltage circuit in the embodiment of this invention is configured appropriately to ensure that the ratio of the emitter area of transistor $Q_1$ to the emitter area of transistor $Q_2$ ($E_{A2}/E_{A1}$), resistance $RV_1$ of resistor element $R_1$, resistance $RV_2$ of resistor element $R_2$, resistance $RV_3$ of resistor element $R_3$, and resistance of $RV_4$ resistor element $R_4$ meet the aforementioned formula.

The aforementioned constant-voltage circuit of this invention may be manufactured using the manufacturing method of the conventional semiconductor devices. For example, the manufacturing method of IC device may be used for manufacturing the constant-voltage circuit shown in FIG. 1, or the constant-voltage circuit may also be composed of discrete circuit elements that meet the aforementioned conditions.

At the time when there is no temperature dependence, output voltage $V_{OUT}$ can be represented as follows from the first item and second item of formula 21:

$$V_{OUT}=(RV_0/RV_1)\cdot ln(E_{A2}/E_{A1})\ (23.5\times10^{-3})+0.76\times(RV_0\cdot RV_2)/[(RV_2+RV_3)\cdot RV_4] \quad (23)$$

The following data is applied to formula 23.

With resistance $RV_1=3.4\ k\Omega$, resistance $RV_2=5\ k\Omega$, resistance $RV_3=40\ k\Omega$, resistance $RV_4=10\ k\Omega$, ($E_{A2}/E_{A1}=3$), and resistance $RV_0=31\ k\Omega$, the output voltage $V_{OUT}\approx 0.5$ V. That is, it is possible to obtain a reference voltage of 1 V or lower with temperature compensation.

The lowest voltage of battery 1 is equal to ($V_{CEQ5}+V2+V_{BEQ6}$), the sum voltage of base-emitter voltage $V_{CEQ5}$ of transistor $Q_5$, inter-terminal voltage V2 of resistor element $R_2$, and base-emitter voltage $V_{BEQ6}$ of transistor $Q_6$. The constant-voltage circuit shown in FIG. 1 can operate sufficiently by means of battery 1 with about 1 V.

In order to make the constant-voltage circuit shown in FIG. 1 operate, power source voltage $V_{IN}$ has to meet the following two conditions:

$$V_{IN} > V_{OUT} + V_{CEQ8SAT} + V_{R4}$$

$$V_{IN} > V_{BEQ6} + V2 + V_{CEQ5}$$

When output voltage $V_{OUT}$ is set, the value should be appropriate to ensure that transistor $Q_8$ operates. Consequently, when a bipolar transistor with base-emitter voltage $V_{BE}=0.6$ V is used, the aforementioned constant-voltage circuit can operate by using a power voltage of 0.8 V.

The constant-voltage circuit in this embodiment outputs an output voltage $V_{OUT}$ defined in formula 20. Consequently, as the voltage of battery 1, there is no limitation from energy band-gap voltage $V_{BG}$. Consequently, the condition of formula 20 is used, for example, the voltage range is set as defined by the resistance value $RV_0$ of load resistor element $R_0$.

Figure 2:
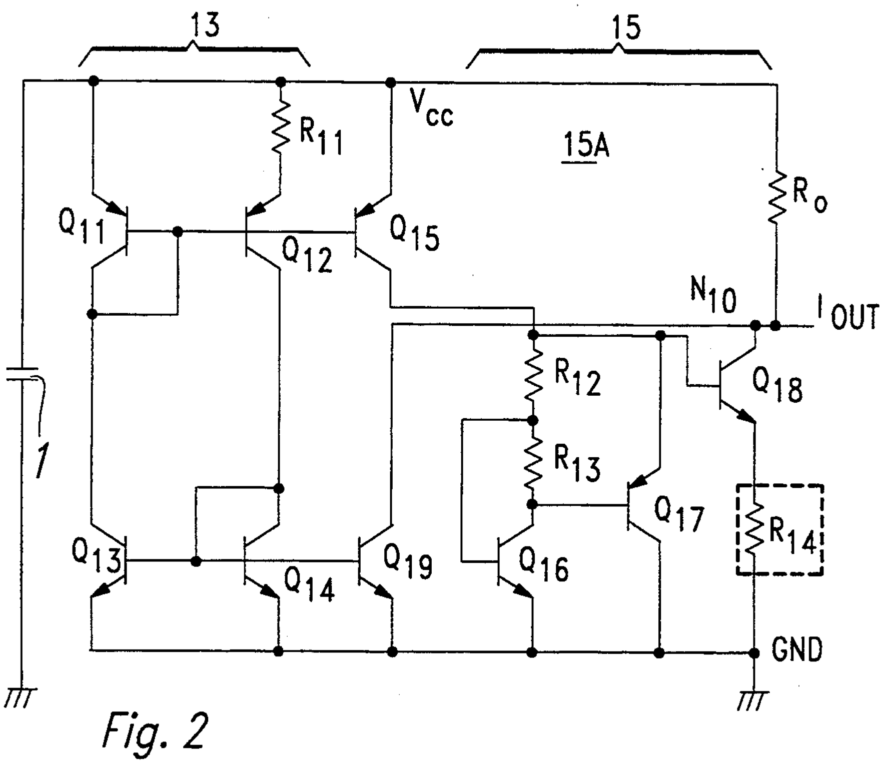
FIG. 2 is a circuit diagram of the constant-voltage circuit in Embodiment 2 of this invention.

FIG. 2 shows the circuit configuration of Embodiment 2 of the constant-voltage circuit of this invention.

The first configuration shown in FIG. 2 differs from the circuit configuration of the constant-voltage circuit shown in FIG. 1, in which the npn-type transistor energy band-gap voltage is used, in that the circuit configuration makes use of the energy band-gap voltage of the pnp-type transistor with reverse characteristics. However, the basic operation is identical to that of the constant-voltage circuit described with reference to FIG. 1.

Figure 3:
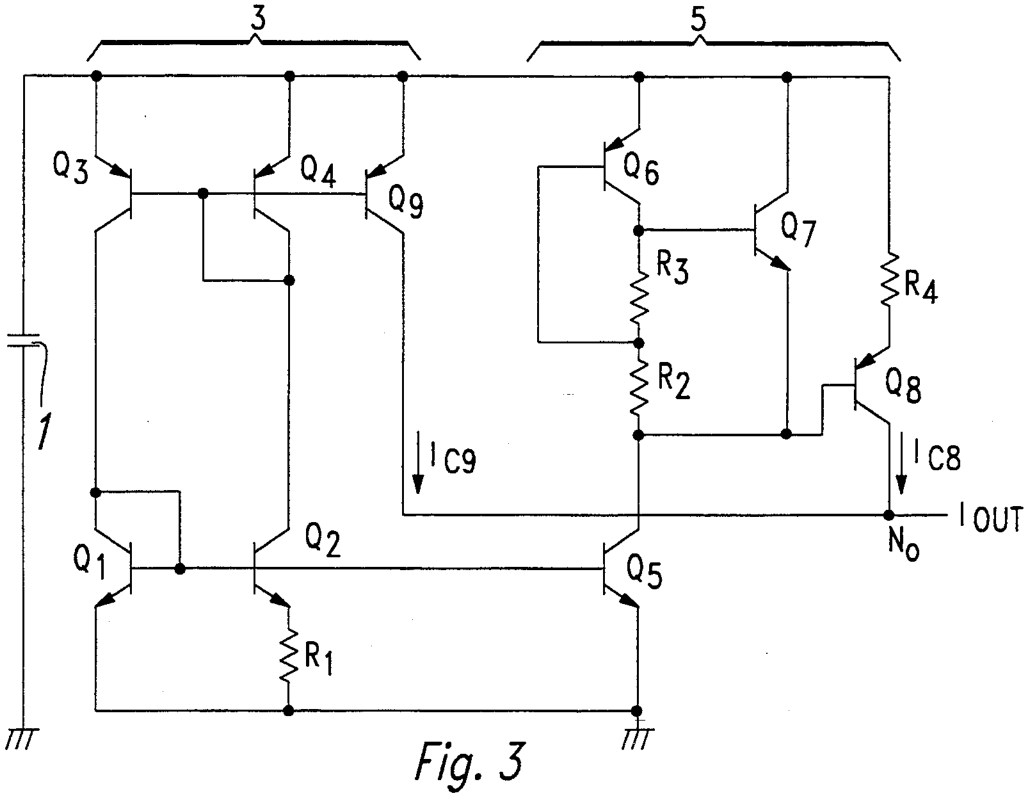
FIG. 3 is a circuit diagram of the constant-current circuit in this invention.

FIG. 3 shows the circuit configuration of the constant-current circuit of this invention.

The circuit configuration shown in FIG. 3 is a constant-current circuit formed by eliminating load resistor element $R_0$ as a current conversion element 7 from the circuit shown in FIG. 1.

In the constant-voltage circuit shown in FIG. 1, the constant voltage is output as the voltage $V_{OUT}$ between terminal of load resistor element $R_0$. On the other hand, for the constant-current circuit shown in FIG. 3, the operation is performed in the same way as the constant-voltage circuit shown in FIG. 1 except that the sum current $I_0$ of collector current $I_{C9}$ of transistor $Q_9$ and collector current $I_{C8}$ of transistor $Q_8$ is provided from node $N_0$.

In this case, current $I_0$ at node $N_0$ can be represented by the following formula:

$$I_0 = (I_{C8} + I_{C9}) \quad (24)$$

This current $I_0$ may not be a sufficiently large current. However, this constant-current circuit is an appropriate circuit for providing a temperature-independent stable current to $I^2L$ circuit or other circuit element with a low current consumption.

Just as the modified example of the circuit shown in FIG. 1, the constant-current circuit of this invention may also be a constant-current circuit (not shown in the figure) formed with load resistor element $R_0$ removed from the constant-voltage circuit shown schematically in FIG. 2.

When the constant-voltage circuit and constant-current circuit of this invention are to be formed actually, the circuit configuration is not limited to what described in the above.

In addition, as opposed to that which is explained in the above, this invention may also be implemented by using a low battery voltage, with a temperature dependence. That is, in the aforementioned example, the operation of the constant-voltage circuit or constant-current circuit is performed under condition without temperature dependence. However, in the case of operation with temperature dependence, the conditions in formula 22 should be set appropriately to ensure the desired temperature dependence.

As explained in the above, for the constant-voltage circuit of this invention making use of a band-gap-type constant-current source circuit, it is possible to use a low-voltage battery with a voltage higher than the basic voltage that is required for operation of the transistor to provide a reference voltage lower than 1 V with a sufficient temperature compensation.

In this constant-voltage circuit, the output voltage can be adjusted by means of the value of the load resistor element, and the output voltage is independent of the energy band-gap voltage.

In addition to the ability of operation at a low voltage, this constant-voltage circuit also has a low power consumption. Consequently, it is possible to use a small number of batteries with a low voltage over a long period of time without exchange. As a result, the constant-voltage circuit of this invention can be preferably used in the portable electronic equipment with limited space for the constant-voltage circuit.

According to this invention, by simply removing the load resistor element from the constant-voltage circuit it is possible to provide a constant-current circuit with the same effect as described in the above.

I claim:

1. A constant-voltage circuit comprising:

a first constant-current source circuit having a first temperature coefficient;

a second constant-current source circuit parallel to said first constant current source and having a second temperature coefficient wherein said second constant-current source comprises:

a transistor;

a first resistor element connected between the base and emitter of said transistor; and a second resistor element connected in series to the collector of said transistor; and a current conversion element which can convert the sum of the current from said first constant-current source circuit and said second constant current source circuit into a voltage.

2. The circuit of claim 1 wherein said first constant-current source circuit comprises a current-mirror-type constant-current source circuit.

3. The circuit of claim 1, wherein said second temperature coefficient is the reverse of said first temperature coefficient and the absolute value of said first temperature coefficient and said second temperature coefficient are equal or nearly equal.

4. The circuit of claim 1 wherein said first resistor element comprises at least two resistors.

5. The circuit of claim 1 wherein the ratio of area between a pair of transistors that form said first constant-current source circuit, and the value of said first resistor element and the value of said second resistor element are adjusted such that said first temperature coefficient and said second temperature coefficient cancel each other resulting in said circuit being operable without temperature dependence.

6. A constant-current circuit comprising:

a first constant-current source circuit having a first temperature coefficient;

a second constant-current source circuit parallel to said first constant current source and having a second temperature coefficient wherein said second constant-current source comprises:

a transistor;

a first resistor element connected between the base and emitter of said transistor; and a second resistor element connected in series to the collector of said transistor.

7. The circuit of claim 6 wherein said first constant-current source circuit comprises a current-mirror-type constant-current source circuit.

8. The circuit of claim 6, wherein said second temperature coefficient is the reverse of said first temperature coefficient and the absolute value of said first temperature coefficient and said second temperature coefficient are equal or nearly equal.

9. The circuit of claim 6 wherein said first resistor element comprises at least two resistors.

10. The circuit of claim 6 wherein the ratio of area between a pair of transistors that form said first constant-current source circuit, and the value of said first resistor element and the value of said second resistor element are adjusted such that said first temperature coefficient and said second temperature coefficient cancel each other resulting in said circuit being operable without temperature dependence.

* * * * *